United States Patent
Maheshwari et al.

(10) Patent No.: US 7,471,102 B2
(45) Date of Patent: Dec. 30, 2008

(54) MEASURING THRESHOLD VOLTAGE OF TRANSISTORS IN A CIRCUIT

(75) Inventors: Atul Maheshwari, Portland, OR (US); Greg Taylor, Portland, OR (US)

(73) Assignee: Intel Corporation, Santa Clara, CA (US)

(*) Notice: Subject to any disclaimer, the term of this patent is extended or adjusted under 35 U.S.C. 154(b) by 6 days.

(21) Appl. No.: 11/710,359

(22) Filed: Feb. 23, 2007

(65) Prior Publication Data

US 2008/0204156 A1 Aug. 28, 2008

(51) Int. Cl.
*G01R 31/26* (2006.01)
*G01R 31/28* (2006.01)

(52) U.S. Cl. .................... 324/769; 324/158.1

(58) Field of Classification Search ............... 324/765, 324/158.1, 500, 769, 763; 327/156, 539, 327/47, 77, 291, 295, 158; 331/57, 17, 44, 331/34, 25, 176; 326/95, 31; 365/203
See application file for complete search history.

(56) References Cited

U.S. PATENT DOCUMENTS

| 4,513,258 A | * | 4/1985 | Jamiolkowski et al. | ...... 331/111 |
| 7,323,908 B2 | * | 1/2008 | Chuang et al. | ............... 326/83 |

* cited by examiner

*Primary Examiner*—Ha Tran T Nguyen
*Assistant Examiner*—Tung X Nguyen
(74) *Attorney, Agent, or Firm*—Trop, Pruner & Hu, P.C.

(57) ABSTRACT

In one embodiment, the present invention includes an oscillator to generate a first frequency and a second frequency. The oscillator includes a plurality of stage cells, each stage cell including a first transistor of a first polarity and a second transistor of a second polarity, each coupled between a first voltage node and a first intermediate node and an inverter coupled to the first intermediate node. In operation, a difference between the first frequency and the second frequency is proportional to a threshold voltage of the second transistor. Other embodiments are described and claimed.

14 Claims, 5 Drawing Sheets

MEASURING THRESHOLD VOLTAGE OF TRANSISTORS IN A CIRCUIT

BACKGROUND

Modern semiconductor components such as microprocessors, memories and so forth are formed with millions of transistors and other components. To enable operation of a transistor, a voltage is applied to a gate of the transistor. Generally, this voltage must be greater than a so-called threshold voltage in order to turn the transistor on. If instead the gate voltage is less than the transistor's threshold voltage, generally the transistor will remain off.

Variations in the threshold voltage of metal oxide semiconductor field effect transistors (MOSFETs) can cause significant variation in circuit performance and leakage power. No known methods currently exist for monitoring variations in threshold voltage across a product. A discrete device placed in a test structure in a wafer scribe line of a wafer that includes many semiconductor die can provide a very coarse estimation of threshold voltage variation. However, measuring discrete devices on die creates a technical challenge, and may also require a long testing time, and is thus not feasible for high volume manufacturing (HVM) testing.

BRIEF SUMMARY OF THE INVENTION

In one embodiment, the present invention includes an oscillator to generate a first frequency and a second frequency. The oscillator includes a plurality of stage cells, each stage cell including a first transistor of a first polarity and a second transistor of a second polarity, each coupled between a first voltage node and a first intermediate node and an inverter coupled to the first intermediate node. In operation, a difference between the first frequency and the second frequency is proportional to a threshold voltage of the second transistor.

DETAILED DESCRIPTION

In various embodiments, a plurality of test circuits may be located across each die of a semiconductor wafer. These circuits may be used to test for variations in threshold voltage of an associated transistor during operation of the completed microelectronic device, which may be a processor including a large cache memory, a digital signal processor (DSP), a memory, or other such device. That is, in various embodiments the circuits present in each die may be used during high volume manufacturing (HVM) testing of packaged chips to enable testing of threshold voltage variation across a given chip.

While the scope of the present invention is not limited in this regard in various embodiments multiple circuits, which may be in the form of oscillator circuits, may be interspersed across each die of a semiconductor wafer. After packaging, HVM testing may be performed to determine an amount of variation of the threshold voltage for a transistor such as a MOSFET associated with each such circuit. In various embodiments, differing amounts of oscillator circuits may be present on a given die. For example, in some implementations approximately between 50 and 100 such circuits may be provided. During HVM testing, each circuit may be enabled for operation by a test controller to provide a measurement, in the form of a frequency of the oscillator circuit, to the test controller, which may analyze, store, and/or output the frequency values in order to determine a range of threshold voltages. Depending on the range, a given chip may pass or fail the HVM testing.

Figure 1:
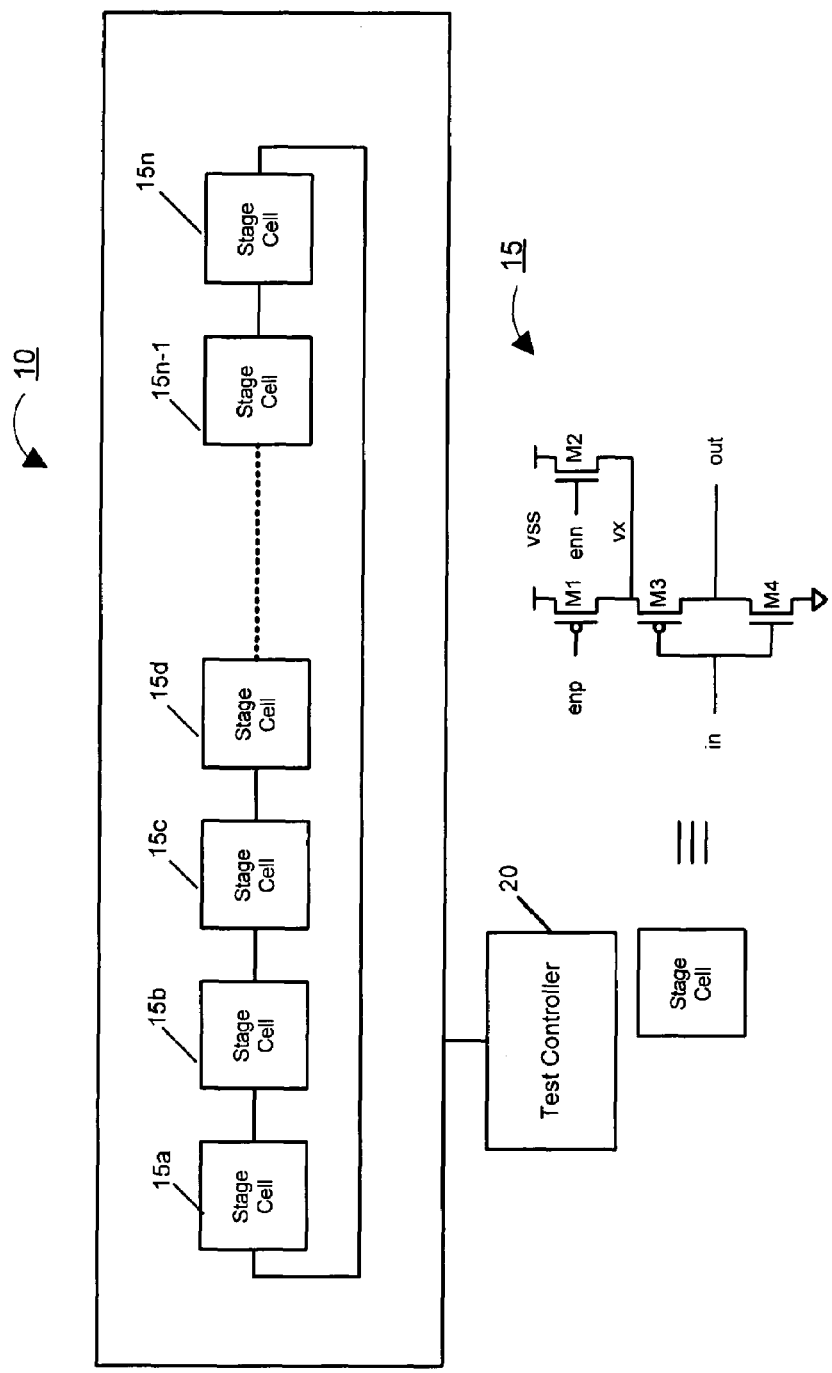
FIG. 1 is a schematic diagram of a test circuit in accordance with one embodiment of the present invention.

Referring now to FIG. 1, shown is a schematic diagram of a test circuit in accordance with one embodiment of the present invention. As shown in FIG. 1, a test circuit 10 may take the form of an oscillator having an odd numbered plurality of stages $15_A$-$15_N$ (generically stage cell 15). Also shown in FIG. 1 is a schematic view of one such stage cell 15. Specifically, as shown in FIG. 1, stage cell 15 may include four transistors, M1-M4. As shown, transistors M1 and M3 may be pMOSFET (PMOS) transistors, while transistors M2 and M4 may be nMOSFET (NMOS) transistors. Control transistors M1 and M2 may have source and drain, respectively, coupled to a supply voltage VSS. Further, transistors M1 and M2 may have gates coupled to receive an enable voltage, namely enp for transistor M1 and enn for transistor M2. In turn, the drain terminal of transistor M1 and the source terminal of transistor M2 are coupled to a node VX, to which a source of transistor M3 is also coupled. The drain terminal of transistor M3 and the drain terminal of transistor M4 are coupled at an output of stage cell 15. Transistor M4 has a source terminal coupled to a ground voltage. Further, as shown in FIG. 1 the gates of transistors M3 and M4 are coupled to receive an input signal, which may correspond to an output of a previous stage cell. A test controller 20 may be coupled to test circuit 10. While shown with only one such test circuit in FIG. 1, in various embodiments many such test circuits may be present on a single die, each coupled to test controller, which may be hardware, software or firmware, or combinations thereof.

FIG. 1 thus shows a circuit that measures variation in threshold voltage and can be instantiated multiple times at regular intervals across a chip. Transistors M3 and M4 form an inverter with the voltage at node VX acting as VSS. Transistors M1 and M2 control the voltage at node VX. When enable signal enp is low and enable signal enn is low, M1 is on while M2 is off. As a result, the voltage at node VX is approximately equal to VSS. M1 may be sized much larger than M3 and M4 to minimize the drop across the on transistor. Alternatively, M1 can be substantially the same size as M3 and node VX shorted between stages, providing an effective M1 size that is n times larger than M3. When enp is high and enn is high, M1 is off while M2 is on. Note that a test controller may provide the enable signals enn and enp. As a result, the voltage at node VX is approximately equal to VSS minus the threshold voltage (VTN) of M2. The voltage at node VX is limited to VSS-VTN(M2) because if it goes any higher, it will move transistor M2 into the subthreshold region and shut it off.

Figure 2:
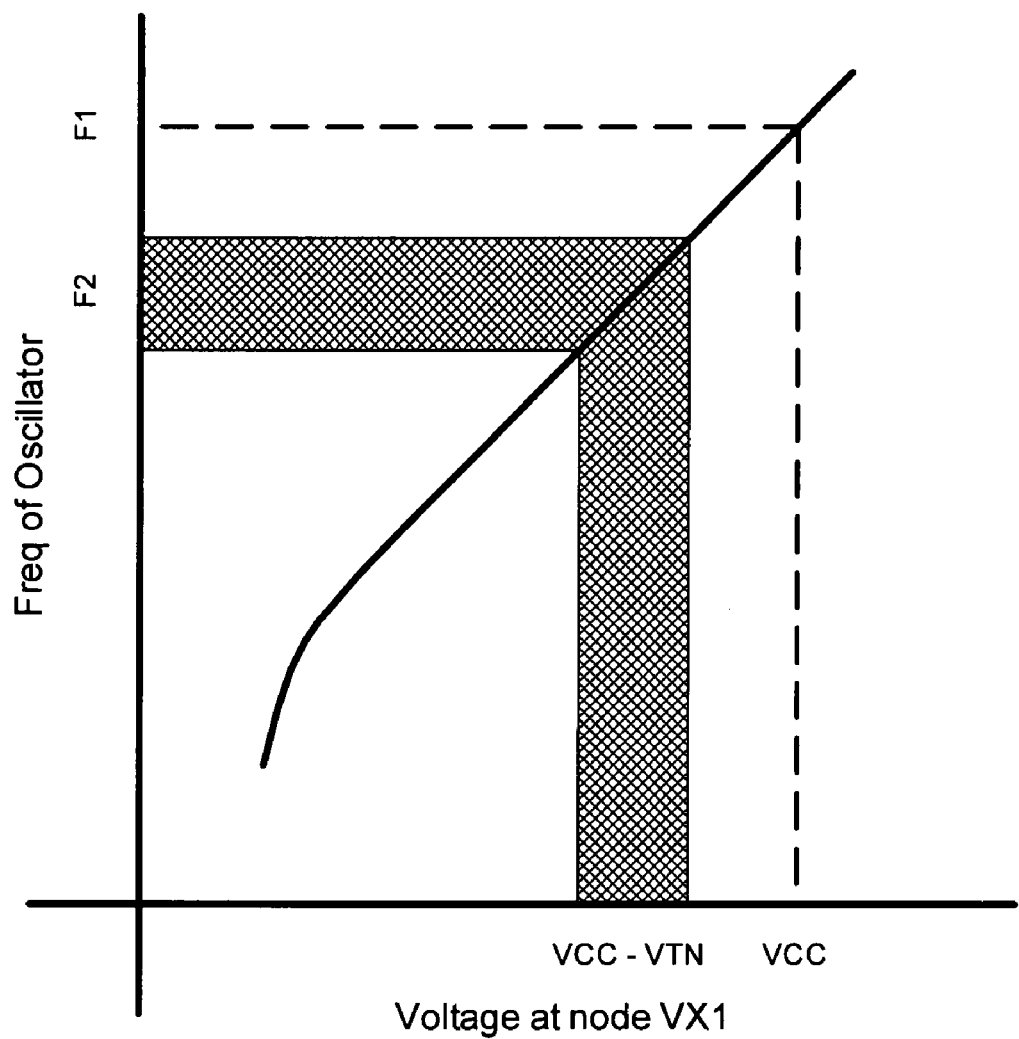
FIG. 2 is a graphical representation of frequency dependence of an oscillator on supply voltage in accordance with one embodiment of the present invention.

The structures shown in FIG. 1 can be constructed using varying length or types of devices to measure their threshold voltage variation. The difference in frequency of the two measurements thus mostly depends on the threshold voltage of transistor M2. FIG. 2 shows the frequency dependence of the oscillator on supply voltage. As shown, the frequency of oscillator 10 may have a linear dependence on the supply voltage. Assuming that the supply voltage is constant between the two measurements, the difference is proportional to the threshold voltage. Supply voltage noise is not a significant issue because oscillator 10 has an averaging effect, and thus only very low frequency noise in supply voltage is an issue. Also, by increasing the sampling time of the measurement, the noise frequency of impact can be made arbitrarily low. These test measurements may be made when the die is quiet and the only power consumption is due to leakage and hence the supply noise is very small to begin with.

Figure 3:
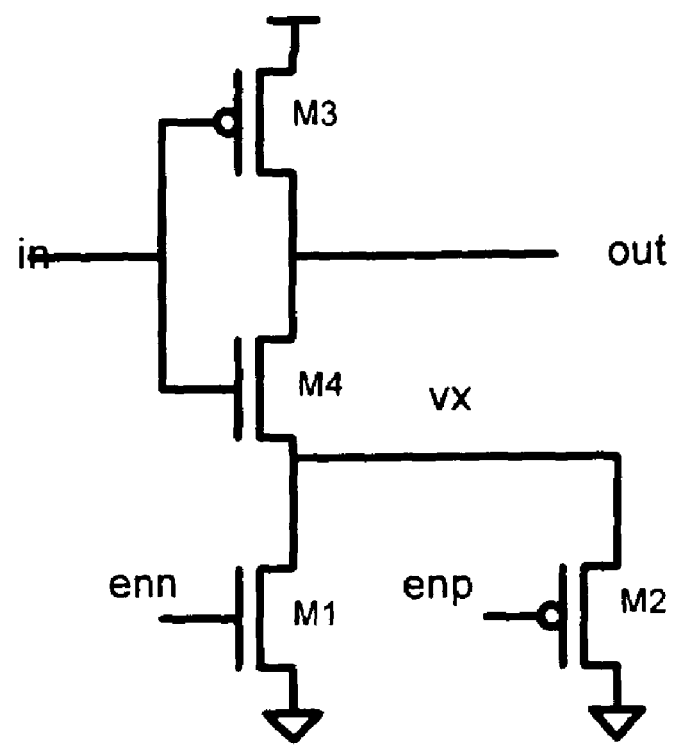
FIG. 3 is a schematic diagram of a stage cell in accordance with another embodiment of the present invention.

In another embodiment, a similar stage cell structure may be present to enable measuring of PMOS threshold voltages. In this embodiment, as shown in FIG. 3, stage cell 25 includes an inverter formed of transistors M3 and M4 which may be coupled between a supply voltage, VSS and an intermediate node, VX. In turn, the two control transistors M1 and M2 may have, respectively, source and drain terminals coupled to the intermediate node and drain and source terminals, respectively, coupled to a ground potential. Furthermore, M1, which is an nMOSFET may be controlled by a first enable signal, enn, while transistor M2, which may be a pMOSFET is controlled by a second enable signal enp. In operation, a measurement first may be made with transistor M1 enabled and transistor M2 disabled. This supplies the full supply voltage (VSS, ground) to the oscillator. For the next measurement, transistor M1 may be disabled and transistor M2 enabled. In this way, a supply voltage of VSS minus (ground+threshold voltage of M2 (VTP)) may be applied to the oscillator. The difference in these measurements may be proportional to the threshold voltage of transistor M2.

Figure 5:
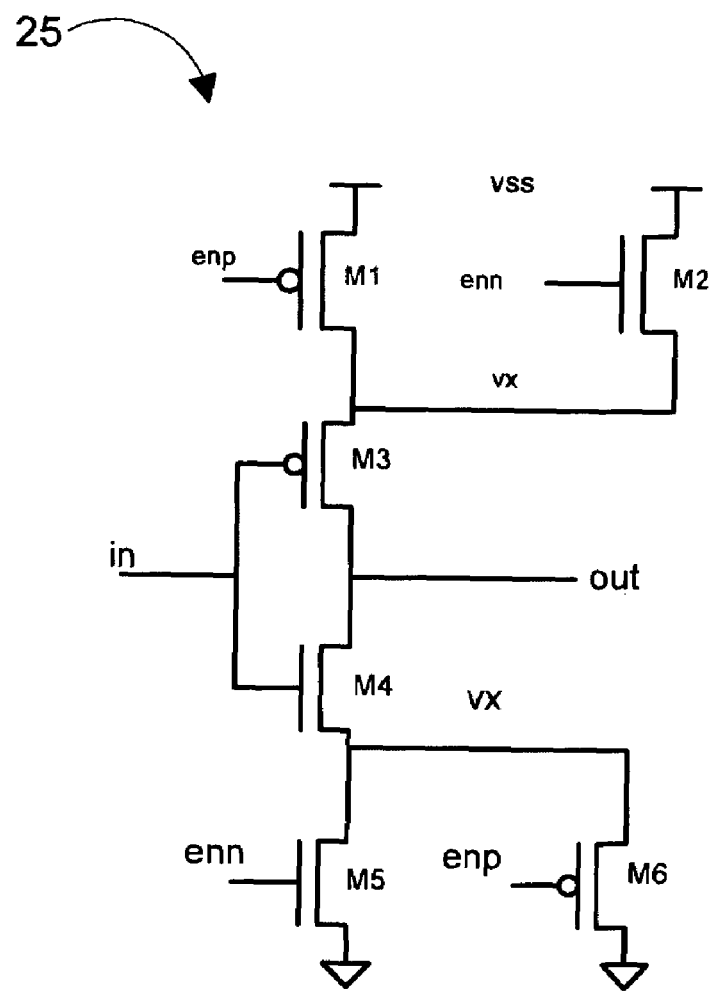
FIG. 5 is a schematic diagram of a stage cell in accordance with another embodiment of the present invention.

In still further embodiments, a combined stage cell structure may be formed that can measure both NMOS and PMOS threshold voltages. Basically, this stage cell may be formed as a combination of the stage cells of FIGS. 1 and 3, as shown in FIG. 5, in which transistors M1 and M2 of the FIG. 3 embodiment are renumbered as transistors M5 and M6. More specifically, the control transistors M1 and M2 of FIG. 1 may be coupled between the supply voltage and the inverter formed of transistors M3 and M4, and the control transistors M1 and M2 of FIG. 3 (renumbered as M5 and M6 in FIG. 5) may be coupled between the source terminal of transistor M4 and ground. Thus in such embodiments oscillator circuits formed of this stage cell structure can measure both NMOS and PMOS threshold voltages, as well as the combination of both. For such testing, first the test controller may enable control transistors M1 and then M2 of the FIG. 1 embodiment, and then control transistors M1 and M2 of the FIG. 3 embodiment (renumbered as M5 and M6 in FIG. 5) may be enabled iteratively. Because threshold voltage changes with temperature, this oscillator circuit may also be used as a temperature sensor that is easy to distribute across a die and is very small in size.

Figure 4:
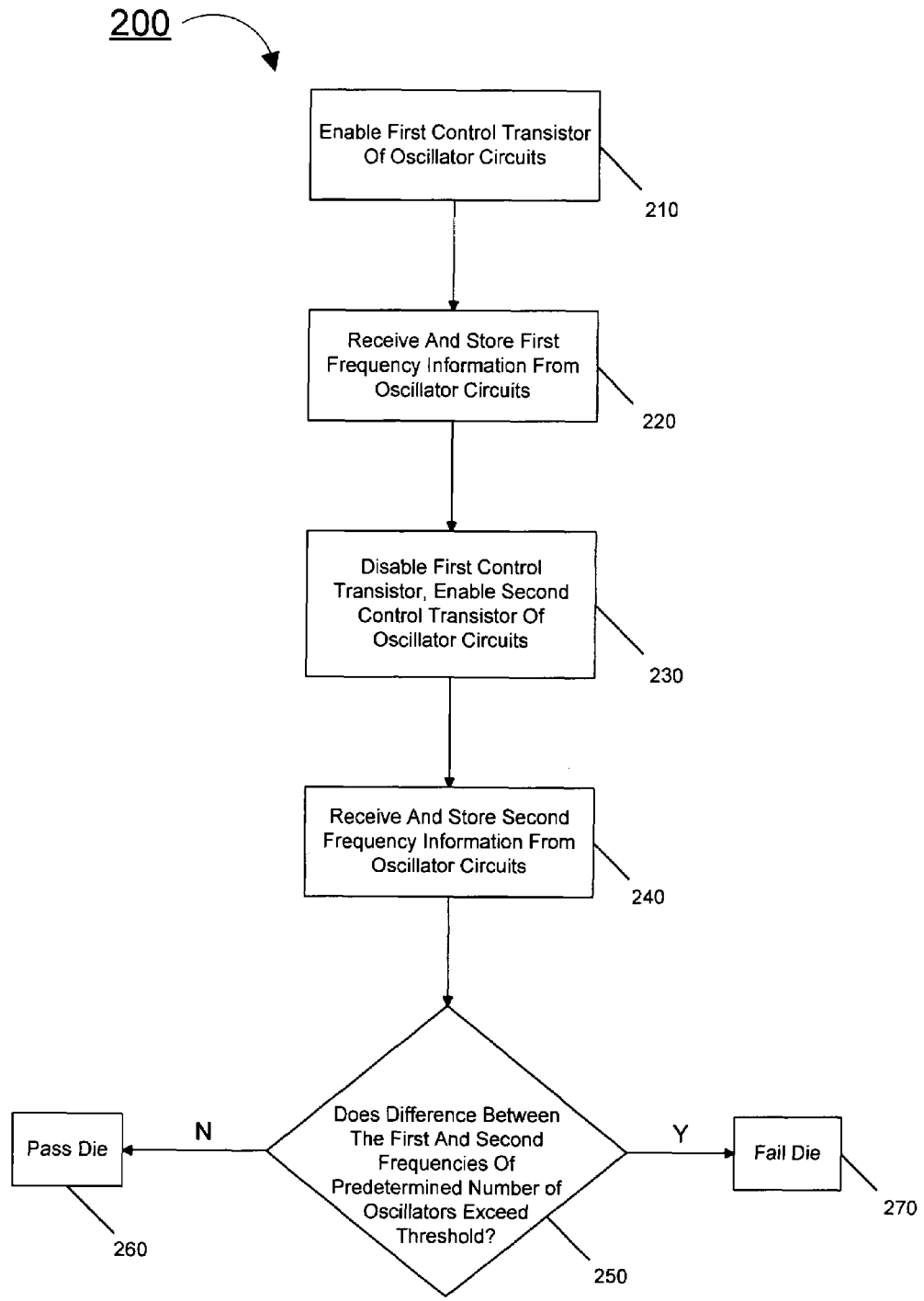
FIG. 4 is a flow diagram of a method in accordance with an embodiment of the present invention.

Referring now to FIG. 4, shown is a flow diagram of a method in accordance with an embodiment of the present invention. As shown in FIG. 4, method 200 may be performed by a test controller. As shown in FIG. 4, method 200 may begin by enabling a first control transistor of the oscillator circuits (block 210). Then the test control may receive and store first frequency information from the oscillator circuits (block 220). Then the test controller may disable the first control transistor, and enable the second control transistor of the oscillator circuits (block 230). Then, at block 240 the test control may receive and store second frequency information from the oscillator circuits.

Referring still to FIG. 4, next at diamond 250 it may be determined whether a difference between the first and second frequencies of a predetermined number of the oscillator circuits exceeds a threshold (diamond 250). In various embodiments, this threshold may be based on a percentage, e.g., between approximately 5-10%, in some implementations. If the differences do not exceed the threshold, control passes to block 260 where the die associated with the oscillator circuits and test controller may pass. Otherwise, the semiconductor die may be indicated as a failure (block 270). Still further, these measurements may be used in binning completed products into different performance categories. While shown with this particular implementation in the embodiment of FIG. 4, the scope of the present invention is not limited in this regard. For example, the frequency information obtained in block 240 may be used to measure profiles across a wafer and use this parameter information to aid in understanding causes of such variations in efforts to reduce the variations. Further, in addition to enabling control voltages for the first and second control transistors, in implementations having circuitry for testing both PMOS and NMOS devices, enable signals to enable measurement of voltages for the opposite polarity device may also be provided and measurements made.

In various embodiments, random and systematic variation in threshold voltage of MOSFETS may be estimated using oscillator circuits that are located across a die. In some embodiments such surface may be sprinkled across a die at a granularity of between approximately 500-1000 microns to provide a suitable estimate of threshold voltage variation.

While the present invention has been described with respect to a limited number of embodiments, those skilled in the art will appreciate numerous modifications and variations therefrom. It is intended that the appended claims cover all such modifications and variations as fall within the true spirit and scope of this present invention.

What is claimed is:

1. An apparatus comprising:
   a first oscillator circuit to generate a first frequency and a second frequency, the first oscillator circuit including a plurality of stage cells, each stage cell including:
   a first transistor of a first polarity and a second transistor of a second polarity, each coupled between a first voltage node and a first node; and
   an inverter coupled to the first node, the inverter having an input to receive an output of a previous stage cell and an output to be provided to a next stage cell, wherein a difference between the first frequency and the second frequency is proportional to a threshold voltage of the second transistor.

2. The apparatus of claim 1, wherein the inverter comprises a third transistor of the first polarity coupled in series with a fourth transistor of the second polarity, wherein gate terminals of the third transistor and the fourth transistor are to receive the input and output terminals of the third and fourth transistors are to provide the output.

3. The apparatus of claim 2, wherein the first transistor comprises a p-metal oxide semiconductor field effect transistor (pMOSFET) transistor and the second transistor comprises a nMOSFET transistor.

4. The apparatus of claim 3, further comprising a plurality of oscillator circuits, each to generate the first and second frequencies, each including the plurality of stage cells, wherein the plurality of oscillator circuits are located at a plurality of locations across a die of the apparatus, the apparatus comprising a semiconductor package.

5. The apparatus of claim 2, wherein each stage cell further includes:

a fifth transistor of the second polarity and a sixth transistor of the first polarity, each coupled between a second voltage node and the inverter.

6. The apparatus of claim 5, further comprising a test controller to iteratively enable the first transistor, the second transistor, the fifth transistor, and the sixth transistor.

7. The apparatus of claim 4, further comprising a test controller coupled to receive the first and second frequencies of each of the plurality of oscillator circuits to measure a variation of the threshold voltage across the die.

8. The apparatus of claim 7, wherein the test controller is to enable the plurality of oscillator circuits during high volume manufacturing testing and otherwise to maintain the plurality of oscillator circuits disabled.

9. The apparatus of claim 1, wherein the first oscillator circuit is to generate the first frequency when the first transistor is enabled and the second transistor is disabled and is to generate the second frequency when the first transistor is disabled and the second transistor is enabled.

10. A method comprising:
enabling a first transistor of a plurality of oscillator circuits formed on a semiconductor die, each of the plurality of oscillators to generate a first frequency when the first transistor is enabled, the plurality of the first oscillator circuits each including a plurality of stage cells, each stage cell including the first transistor and a second transistor of a second polarity, each coupled between a first voltage node and a second node, and an inverter coupled to the second node, the inverter having an input to receive an output of a previous stage cell and an output to be provided to a next stage cell;
measuring and storing the first frequency of each of the plurality of oscillator circuits when the first transistor is enabled;
enabling the second transistor of the plurality of oscillator circuits to generate a second frequency;
measuring and storing the second frequency of each of the plurality of oscillator circuits when the second transistor is enabled; and
determining a difference between the first frequency and the second frequency of each of the plurality of oscillator circuits, the difference proportional to a threshold voltage of the second transistor.

11. The method of claim 10, further comprising disabling the plurality of oscillator circuits during normal operation of the semiconductor die.

12. The method of claim 10, further comprising enabling the first transistor and the second transistor of the plurality of oscillator circuits during high volume manufacture testing of the semiconductor die.

13. The method of claim 12, further comprising failing the semiconductor die if at least a predetermined number of the plurality of oscillator circuits cause the difference to exceed a threshold.

14. The method of claim 12, further comprising binning the semiconductor die according to the determined differences.

* * * * *